(12) United States Patent
Kim et al.

(10) Patent No.: US 10,958,237 B2
(45) Date of Patent: Mar. 23, 2021

(54) BULK ACOUSTIC WAVE RESONATOR

(71) Applicant: Samsung Electro-Mechanics Co., Ltd., Suwon-si (KR)

(72) Inventors: Tae Yoon Kim, Suwon-si (KR); Chang Hyun Lim, Suwon-si (KR); Sang Kee Yoon, Suwon-si (KR); Tae Kyung Lee, Suwon-si (KR); Moon Chul Lee, Suwon-si (KR); Tae Hun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 28 days.

(21) Appl. No.: 16/395,287

(22) Filed: Apr. 26, 2019

(65) Prior Publication Data
US 2020/0119713 A1  Apr. 16, 2020

(30) Foreign Application Priority Data
Oct. 12, 2018  (KR) ........................ 10-2018-0121707

(51) Int. Cl.
*H03H 9/02* (2006.01)
*H03H 9/17* (2006.01)
(Continued)

(52) U.S. Cl.
CPC .......... *H03H 9/02125* (2013.01); *H03H 3/02* (2013.01); *H03H 9/02007* (2013.01);
(Continued)

(58) Field of Classification Search
CPC ...... H03H 9/174; H03H 9/02007; H03H 9/54; H03H 3/02; H03H 9/173; H03H 9/175;
(Continued)

(56) References Cited

U.S. PATENT DOCUMENTS

2005/0237132 A1  10/2005  Sano et al.
2008/0081398 A1  4/2008  Lee et al.
(Continued)

FOREIGN PATENT DOCUMENTS

JP  4373949 B2  11/2009
JP  2018-148548 A  9/2018

OTHER PUBLICATIONS

Korean Office Action dated Feb. 12, 2020 in counterpart Korean Patent Application No. 10-2018-0121707 (6 pages in English and 6 pages in Korean).

*Primary Examiner* — Rakesh B Patel
*Assistant Examiner* — Jorge L Salazar, Jr.
(74) *Attorney, Agent, or Firm* — NSIP Law

(57) ABSTRACT

A bulk-acoustic wave resonator includes a substrate, a cavity formed in the substrate, a first electrode, a piezoelectric layer, and a second electrode stacked in order on the substrate, a resonator defined by the first electrode, the piezoelectric layer, and the second electrode overlapping in a vertical direction in an upper portion of the cavity, an additional layer disposed on one surface of the first electrode arranged in a wiring region on an external side of the resonator, and a wiring electrode connected to the first electrode arranged in the wiring region. The first electrode forms a contact interfacial surface with the additional layer and the wiring electrode.

22 Claims, 6 Drawing Sheets

(51) Int. Cl.
*H03H 9/13* (2006.01)
*H03H 9/54* (2006.01)
*H03H 3/02* (2006.01)

(52) U.S. Cl.
CPC ............ *H03H 9/131* (2013.01); *H03H 9/174* (2013.01); *H03H 9/54* (2013.01); *H03H 9/173* (2013.01)

(58) Field of Classification Search
CPC ....... H03H 2003/021; H03H 2003/025; H03H 9/131; H03H 9/02125; H03H 9/02015; H03H 9/02039; H03H 9/205; H03H 2003/023
USPC .................................. 333/133, 186, 187, 188
See application file for complete search history.

(56) References Cited

U.S. PATENT DOCUMENTS

2016/0308509 A1* 10/2016 Burak .................... H03H 9/173
2018/0254764 A1    9/2018 Lee et al.

* cited by examiner

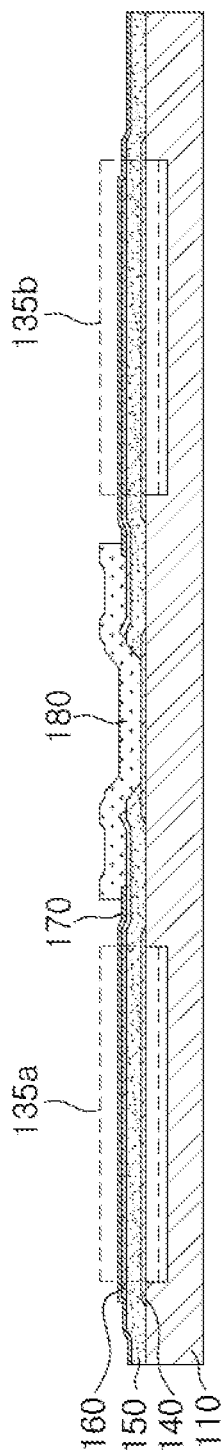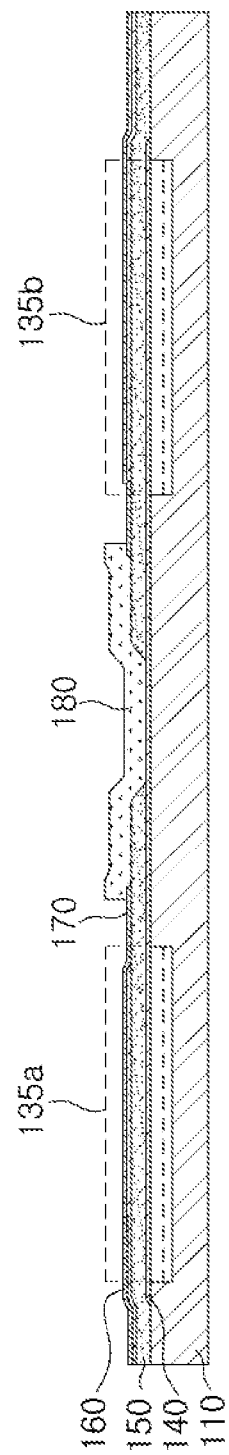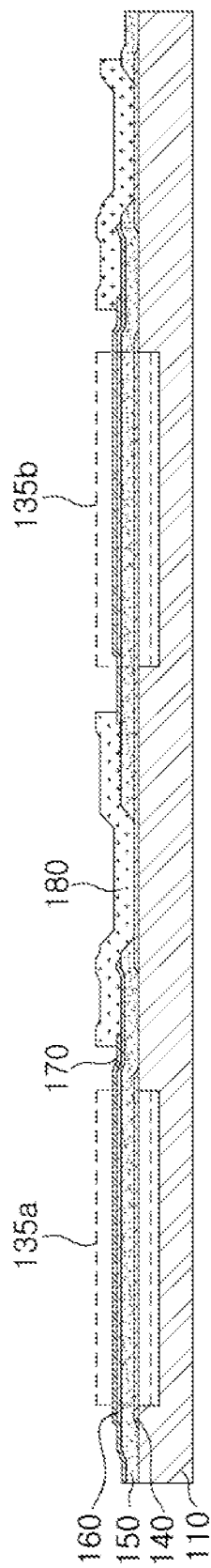

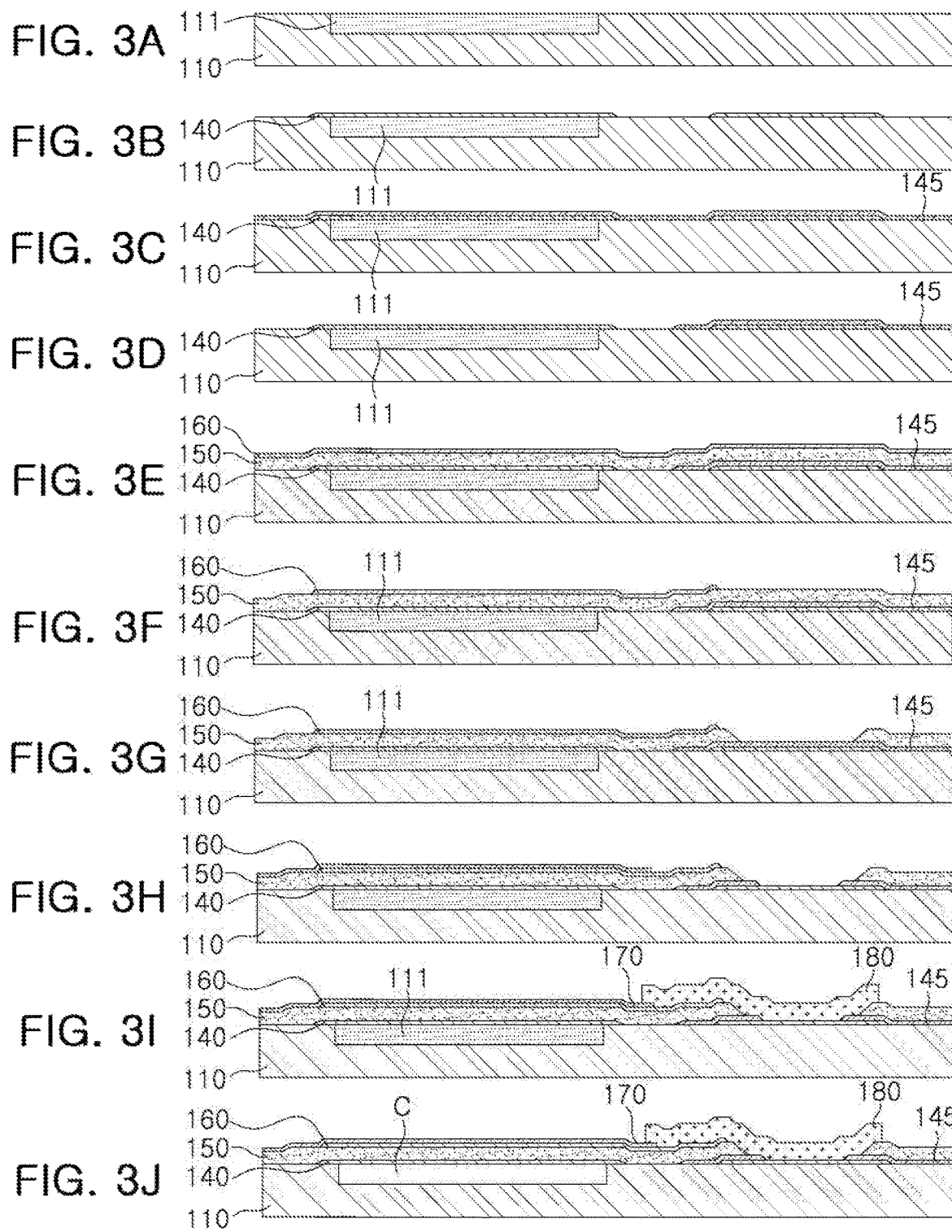

BULK ACOUSTIC WAVE RESONATOR

CROSS-REFERENCE TO RELATED APPLICATIONS

This application claims the benefit under 35 U.S.C. 119(a) of Korean Patent Application No. 10-2018-0121707 filed on Oct. 12, 2018, in the Korean Intellectual Property Office, the entire disclosure of which is herein incorporated by reference for all purposes.

BACKGROUND

1. Field

This application relates to a bulk-acoustic wave resonator.

2. Description of the Background

Recently, with the rapid development of mobile communication devices, chemical and biological devices, and the like, demand for a small-sized lightweight filter, an oscillator, a resonant element, an acoustic resonant mass sensor, and the like, used in such devices, has increased.

Generally, a film bulk acoustic resonator (FBAR) has been used as a means for implementing a small-sized lightweight filter, an oscillator, a resonant element, an acoustic resonant mass sensor, and the like. A film bulk acoustic resonator may be mass produced at significantly low cost, and may be implemented as a microsized resonator. Also, a film bulk acoustic resonator may implement high quality factor (Q), one of main properties of a filter, and may be used in a micro frequency band and may particularly implement a personal communication system (PCS) band and a digital cordless system (DCS) band.

Generally, a film bulk acoustic resonator may include a resonance portion implemented by stacking a first electrode, a piezoelectric layer, and a second electrode in order on a substrate. With regard to operational principles of a film bulk acoustic resonator, an electric field is induced into a piezoelectric layer by electrical energy applied to first and second electrodes, and a piezoelectric effect occurs in the piezoelectric layer due to the induced electric field, such that a resonator may vibrate in a certain direction. As a result, bulk acoustic waves may be generated in the same direction as the vibration direction, and resonance may occur.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes a substrate, a cavity formed in the substrate, a first electrode, a piezoelectric layer, and a second electrode stacked in order on the substrate, a resonator defined by the first electrode, the piezoelectric layer, and the second electrode overlapping in a vertical direction in an upper portion of the cavity, an additional layer disposed on one surface of the first electrode arranged in a wiring region on an external side of the resonator, and a wiring electrode connected to the first electrode arranged in the wiring region. The first electrode forms a contact interfacial surface with the additional layer and the wiring electrode.

The additional layer may be disposed on an upper surface of the first electrode arranged in the wiring region, and may include a pattern exposing the first electrode arranged in the wiring region, and the first electrode arranged in the wiring region may be connected to the wiring electrode through the pattern.

The additional layer may cover edges of the first electrode arranged in the wiring region.

The first electrode arranged in the resonator and the first electrode arranged in the wiring layer may be separated from each other, and the additional layer covering edges of the first electrode arranged in the wiring region may extend to the resonator and be connected to the first electrode of the resonator.

The additional layer may be disposed in an internal region of an upper surface of the first electrode arranged in the wiring region.

The additional layer may include a first additional layer and a second additional layer disposed in order on an upper surface of the first electrode.

The additional layer may be arranged on a lower surface of the first electrode.

The additional layer may be formed of one of an insulating material and a metal.

The additional layer may have an etch rate higher than an etch rate of the first electrode.

The piezoelectric layer may be disposed in an upper portion of the additional layer, and a pattern of the piezoelectric layer may be the same as a pattern of the additional layer.

In another general aspect, a bulk-acoustic wave resonator includes a substrate, a plurality of cavities formed in the substrate, a first electrode, a piezoelectric layer, and a second electrode stacked in order on the substrate, a plurality of resonators defined by the first electrode, the piezoelectric layer, and the second electrode overlapping in a vertical direction in upper portions of the plurality of cavities, a wiring region including a wiring electrode connecting portions of the plurality of resonators, an additional layer disposed on an upper surface of the first electrode arranged in the wiring region, wherein the additional layer is divided into a plurality of regions having different thicknesses, and the plurality of regions are connected to the wiring electrode.

The additional layer may include a first region having a first thickness and a second region having a second thickness.

The first thickness may be greater than the second thickness.

The first region may surround the second region.

The additional layer disposed on an upper surface of the first electrode arranged in the wiring region may be separated from the first electrode arranged in the plurality of resonators.

The additional layer may be formed of a metal.

In another general aspect, a bulk-acoustic wave resonator includes a resonator including a cavity, a first electrode, a piezoelectric layer, and a second electrode stacked in order on a substrate, an additional layer disposed on the first electrode in a wiring region on an external side of the resonator, and a wiring electrode connected to the first electrode disposed in the wiring region, wherein the first electrode forms a contact interfacial surface with the additional layer on the wiring electrode.

The first electrode may form a contact interfacial surface with the wiring electrode.

The additional layer may include a first region having a first thickness and a second region having a second thickness less than the first thickness, and the first electrode may be spaced apart from the wiring electrode by at least the second thickness.

The cavity may be formed above the substrate in a mesa shape or a dome shape.

Other features and aspects will be apparent from the following detailed description, the drawings, and the claims.

BRIEF DESCRIPTION OF DRAWINGS

FIGS. 2A, 2B, and 2C are cross-sectional diagrams illustrating a connection relationship between resonators of a bulk-acoustic wave resonator according to an example embodiment of the present disclosure.

FIGS. 3A, 3B, 3C, 3D, 3E, 3F, 3G, 3H, 3I, and 3J are diagrams illustrating an example process of manufacturing a bulk-acoustic wave resonator according to the one or more example embodiments illustrated in FIG. 1.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
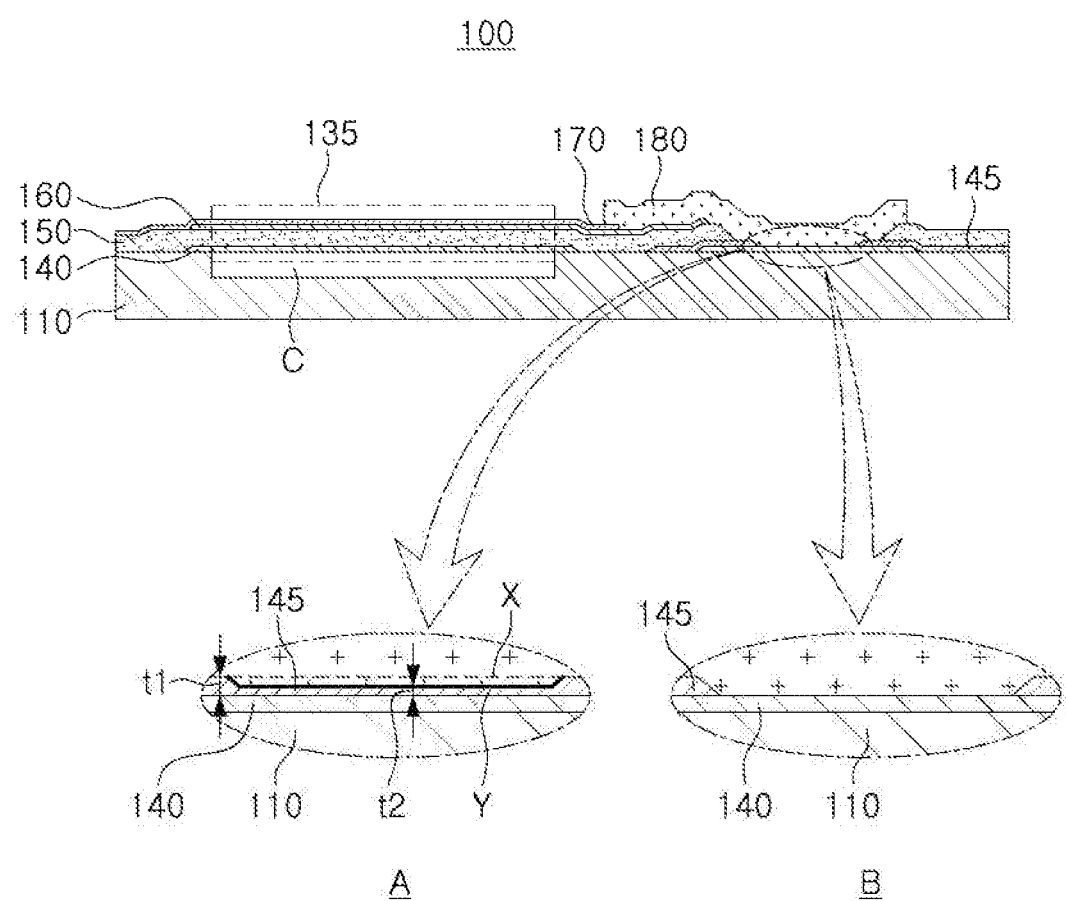
FIG. 1 is a cross-sectional diagram illustrating a bulk-acoustic wave resonator according to one or more example embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, means that at least one example exists in which such a feature is included or implemented while all examples are not limited thereto.

An aspect of the present disclosure is to provide a bulk-acoustic wave resonator capable of preventing loss of electrodes in a wiring region.

FIG. 1 is a cross-sectional diagram illustrating a bulk-acoustic wave resonator according to one or more example embodiments.

Referring to FIG. 1, a bulk-acoustic wave resonator 100 in the one or more example embodiments may be a film bulk acoustic resonator (FBAR). The bulk-acoustic wave resonator 100 may include a substrate 110, a first electrode 140, a piezoelectric layer 150, and a second electrode 160.

The substrate 110 may be formed of silicon (Si), and a partial region of the substrate 110 may be etched in a thickness direction such that a cavity C may be arranged in the substrate 110.

The first electrode 140, the piezoelectric layer 150, and the second electrode 160 may be stacked in order. A common region in which the first electrode 140, the piezoelectric layer 150, and the second electrode 160 overlap in a vertical direction may be positioned in an upper portion of the cavity C. The first electrode 140 and the second electrode 160 may be formed of one of elements among gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof. The first electrode 140 and the second electrode 160 may also include at least one of a rare earth metal and a transition metal.

As the cavity C is disposed in a lower portion of the common region in which the first electrode 140, the piezoelectric layer 150, and the second electrode 160 overlap in a vertical direction, when electrical energy such as a wireless frequency signal is applied to the first electrode 140 and the second electrode 160, the common region may vibrate in a certain direction due to a piezoelectric effect occurring in the piezoelectric layer 150.

Thus, in an upper portion of the cavity C, the first electrode 140, the piezoelectric layer 150, and the second electrode 160 overlapping in a vertical direction may define a resonator 135. A plurality of the cavities C may be formed in the single substrate 110, and in upper portions of the plurality of cavities C, a plurality of the resonators 135 may be formed by the first electrode 140, the piezoelectric layer 150, and the second electrode 160 overlapping in a vertical direction. The region in which the resonator 135 is arranged may be an active region of the bulk-acoustic wave resonator. The resonator 135 may output a wireless frequency signal having a certain frequency using a piezoelectric effect. The resonator 135 may output a wireless frequency signal having a resonance frequency corresponding to vibrations caused by the piezoelectric effect of the piezoelectric layer 150.

The piezoelectric layer 150 may be a portion causing a piezoelectric effect which converts electrical energy into mechanical energy formed as elastic waves. The piezoelectric layer 150 may be formed of one of elements among aluminum nitride (AlN), zinc oxide (ZnO), and lead zirconate titanate (PZT; PbZrTiO). The piezoelectric layer 150 may further include a rare earth metal and a transition metal. As an example, a rare earth metal may include at least one element among scandium (Sc), erbium (Er), yttrium (Y), and lanthanum (La).

A seed layer for improving crystal orientation of the piezoelectric layer 150 may further be disposed in a lower portion of the first electrode 140. The seed layer may be formed of one of elements among aluminum nitride (AlN), doped aluminum nitride (Doped AlN), zinc oxide (ZnO), and lead zirconate titanate (PZT; PbZrTiO).

A protective layer 170 may be arranged on the second electrode 160 of the resonator 135. The protective layer 170 may be disposed on the second electrode 160, and may prevent the second electrode 160 from being externally exposed. The protective layer 170 may be formed of one of insulating materials among a silicon oxide-based material, a silicon nitride-based material, and an aluminum nitride-based material.

A wiring region for interconnecting the plurality of resonators 135 may be arranged in the bulk-acoustic wave resonator 100. In the wiring region, the first electrode 140 and the second electrode 160 extending from the resonator 135 may be connected to a wiring electrode 180 and may be electrically connected to the other resonators 135. The wiring region may be an inactive region in which vibrations of the bulk-acoustic wave resonator are not generated, and the wiring region may be different from the resonator 135, an active region. The wiring region may be an external region of the resonator 135. The wiring electrode 180 may be formed of one of elements among copper (Cu), gold (Au), and aluminum (Al), or alloys thereof.

FIGS. 2A to 2C are cross-sectional diagrams illustrating a connection relationship between resonators of a bulk-acoustic wave resonator according to an example embodiment.

Referring to FIGS. 2A, 2B, and 2C, a bulk-acoustic wave resonator in the example embodiment may include a first resonator 135a and a second resonator 135b.

Referring to FIG. 2A, a second electrode 160 extending from the first resonator 135a and a second electrode 160 extending from the second resonator 135b may be connected to each other through a wiring electrode 180. Referring to FIG. 2B, a first electrode 140 extending from the first resonator 135a and a first electrode 140 extending from the second resonator 135b may be integrated with each other, and may be connected to the wiring electrode 180. Referring to FIG. 2C, the second electrode 160 extending from the first resonator 135a may be interconnected with the first electrode 140 extending from the second resonator 135b through the wiring electrode 180.

Referring to FIGS. 2A, 2B, and 2C, to electrically connect the first resonator 135a and the second resonator 135b, the first electrode 140 and the second electrode 160 extending from the first resonator 135a and the second resonator 135b may need to be connected to the wiring electrode 180.

In the case of the second electrode 160, the second electrode 160 may be connected to the wiring electrode 180 by patterning a partial region of a protective layer 170 by performing an etching process one time, and connecting the second electrode 160 externally exposed through the protective layer 170 to the wiring electrode 180.

In the case of the first electrode 140, to electrically connect the wiring electrode 180 to the first electrode 140, the piezoelectric layer 150 arranged in an upper portion of the first electrode 140, and the second electrode 160 may need to be etched in a thickness direction.

When the first electrode 140 is exposed by etching the piezoelectric layer 150 and the second electrode 160, a portion of the first electrode 140 may be removed due to an error in the etching process. Further, when an electrode is required to have a reduced thickness to filter a wireless frequency of a high frequency region, or when a piezoelectric material having etch selectivity lower than etch selectivity of the first electrode 140, such as a piezoelectric layer including a rare earth metal, is required, the overall first electrode 140 may be removed.

In the bulk-acoustic wave resonator in the examples described herein, an additional layer 145 may be arranged on at least one surface between an upper surface and a lower surface of the first electrode 140 to prevent the removal of the first electrode 140.

Referring back to FIG. 1, the additional layer 145 may be arranged on an upper surface of the first electrode 140 arranged in the wiring region.

The additional layer 145 may be formed of a material having etch selectivity higher than etch selectivity of the first electrode 140. As the additional layer 145 is formed of a material having etch selectivity higher than etch selectivity of the first electrode 140, the amount of a removed portion of the first electrode 140 may be reduced in an etching process. The additional layer 145 may be formed of one of a metal and an insulating material.

FIG. 1 at "A" is a diagram illustrating an example in which the additional layer 145 is formed of a metal, viewed in magnified form, and FIG. 1 at "B" is a diagram illustrating an example in which the additional layer 145 is formed of one of a metal and an insulating material, viewed in magnified form.

Referring to "A" in FIG. 1, to form the wiring electrode 180, a stepped portion may be formed on the additional layer 145 through an etching process in which the second electrode 160 and the piezoelectric layer 150 in the wiring region are patterned. Due to the stepped portion arranged in the additional layer 145, the additional layer 145 may be divided into a first region having a first thickness t1 and a second region having a second thickness t2 (t1>t2, t2≠0). The first region having the first thickness t1 and the second region having the second thickness t2 of the additional layer 145 may be connected to the wiring electrode 180. The first region having the first thickness t1 and arranged in an outer region of the additional layer 145 may surround the second region having the second thickness t2 and arranged in an inner region such that the additional layer 145 may have a groove portion in an inner region.

A first area X illustrated by a dot line in FIG. 1 at "A" may refer to a contact area between the wiring electrode 180 and the additional layer 145 of when the additional layer 145 is formed to be planar, and a second area Y illustrated by a heavy line may refer to a contact area between the wiring electrode 180 and the additional layer 145 of when the additional layer 145 is divided into the first region and the second region having different thicknesses.

When the additional layer 145 is divided into the first region and the second region having different thicknesses, the contact area between the wiring electrode 180 and the additional layer 145 may be increased from the first area X to the second area Y. As the contact area between the wiring electrode 180 and the additional layer 145 increases, contact resistance may reduce.

Referring to "B" in FIG. 1, to form the wiring electrode 180, a pattern may be formed on the additional layer 145 by an etching process in which the second electrode 160 and the piezoelectric layer 150 in the wiring region are patterned. Due to the pattern arranged on the additional layer 145, the first electrode 140 may be externally exposed, and the exposed first electrode 140 may be connected to the wiring electrode 180. Accordingly, the first electrode 140 may form a contact interfacial surface with the additional layer 145 and the wiring electrode 180. FIG. 1 at "B" may be an example embodiment in which the second thickness t2 of the second region illustrated in FIG. 1 at "A" is 0 (t2=0).

In "B" of FIG. 1, when the additional layer 145 is formed of an insulating material, the additional layer 145 formed of an insulating material may be formed of a material having etch selectivity higher than etch selectivity of the first electrode 140 such that the amount of a removed portion of the first electrode 140 may be reduced in an etching process.

In "B" of FIG. 1, when the additional layer 145 is formed of a metal, contact resistance between the additional layer 145 and the wiring electrode 180 may be greater than contact resistance between the additional layer 145 and the first electrode 140. Thus, by directly connecting the first electrode 140 exposed by a pattern of the additional layer 145 to the wiring electrode 180, overall contact resistance may reduce.

FIGS. 3A to 3J are diagrams illustrating an example process of manufacturing a bulk-acoustic wave resonator according to the one or more example embodiments.

Referring to FIGS. 3A to 3J, a process of manufacturing a bulk-acoustic wave resonator may start with preparing a substrate 110 (FIG. 3A). A partial region of the substrate 110 may be etched in a thickness direction, and a sacrificial layer 111 may be formed in the etched partial region. The sacrificial layer 111 may be etched in a subsequent process such that a cavity C may be formed in a region in which the sacrificial layer 111 is disposed.

A first electrode 140 may be arranged on one surface of the substrate 110 (FIG. 3B). The first electrode 140 may be selectively patterned depending on a design. For example, the first electrode 140 extending from a first resonator 135a illustrated in FIGS. 2A and 2C may be patterned, whereas a patterning process may not be applied to the first electrode 140 extending from the first resonator 135a illustrated in FIG. 2B.

In the description below, the bulk-acoustic wave resonator will be described for the examples where the first electrode 140 extending from a resonator may be separated from the first electrode 140 arranged in the wiring region to electrically connect the second electrode 160 extending from the resonator to the other resonator.

An additional layer 145 may be arranged to cover one surface of the first electrode 140 and one surface of the substrate 110 exposed by the first electrode 140 (FIG. 3C), and the additional layer 145 may be patterned to correspond to the first electrode 140 arranged in the wiring region (FIG. 3D). As an example, the additional layer 145 may be patterned to cover the first electrode 140 arranged in the wiring region.

After the additional layer 145 is formed, a piezoelectric layer 150 and a second electrode 160 may be formed in order (FIG. 3E), and to form a wiring electrode 180, the second electrode 160 and the piezoelectric layer 150 in the wiring region may be patterned in order (FIG. 3F and FIG. 3G). The additional layer 145 disposed on the first electrode 140 may be patterned, and the first electrode 140 in the wiring region may be exposed (FIG. 3H). Thus, the additional layer 145 may be patterned to cover edge regions of the first electrode 140 arranged in the wiring region.

After the first electrode 140 in the wiring region is externally exposed, a protective layer 170 may be arranged in a partial region of the second electrode 160, and the wiring electrode 180 may be formed to interconnect the second electrode 160 exposed by the protective layer 170 with the first electrode 140 exposed by the additional layer 145 in the wiring region (FIG. 3I). The sacrificial layer 111 may be etched, and a cavity C may accordingly be formed in a region in which the sacrificial layer 111 is disposed (FIG. 3J).

FIGS. 4 to 9 are cross-sectional diagrams illustrating a bulk-acoustic wave resonator according to one or more other example embodiments.

A bulk-acoustic wave resonator 100 in the examples illustrated in FIGS. 4 to 13 may be similar to the bulk-acoustic wave resonator 100 in the examples illustrated in FIG. 1, and thus, overlapping descriptions may not be repeated, and differences will be described.

Figure 4:
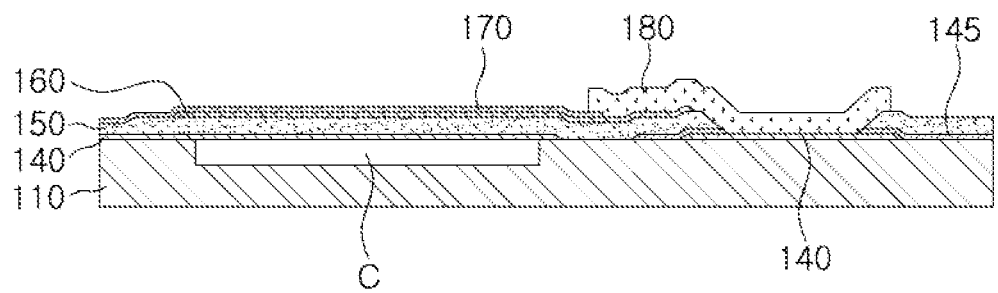
FIGS. 4, 5, 6, 7, 8, and 9 are cross-sectional diagrams illustrating a bulk-acoustic wave resonator according to one or more other example embodiments of the present disclosure.

Referring to FIG. 4, an additional layer 145 and a piezoelectric layer 150 of the bulk-acoustic wave resonator 100 may be etched to have the same slope. As an example, the additional layer 145 and the piezoelectric layer 150 in the wiring region may be simultaneously patterned using the same mask. Accordingly, in the example embodiment of the bulk-acoustic wave resonator illustrated in FIG. 4, an additional process for patterning the additional layer 145 will be omitted such that a process may be simplified, as compared to the example embodiment of the bulk-acoustic wave resonator illustrated in FIG. 1.

Figure 5:
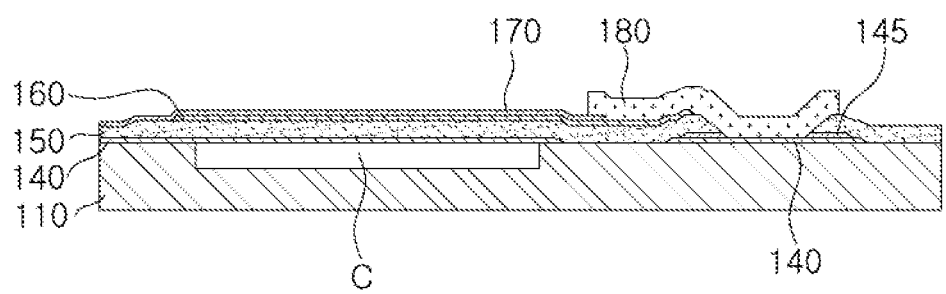

In FIG. 1, the additional layer 145 may cover the first electrode 140 in the wiring region, whereas, in FIG. 5, the additional layer 145 may be disposed in an inner region of an upper surface of the first electrode 140 in the wiring region. The bulk-acoustic wave resonator in the example embodiment illustrated in FIG. 5 may be manufactured in the order of forming the first electrode 140 and the additional layer 145 in sequence, patterning the additional layer 145, and patterning the first electrode 140, differently from the process of manufacturing a bulk-acoustic wave resonator in the example embodiment illustrated in FIG. 1.

Figure 6:
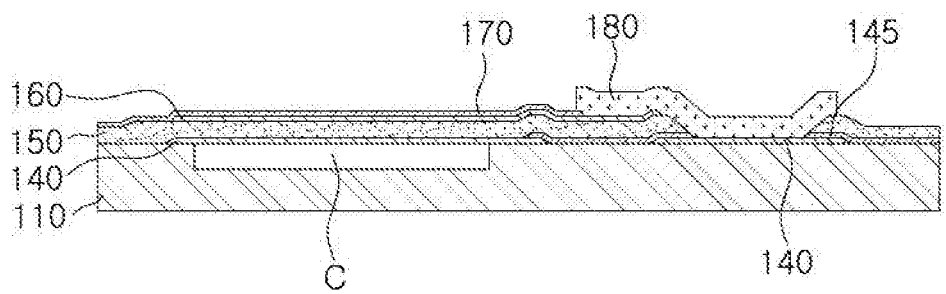

Referring to FIG. 6, an additional layer 145 covering the first electrode 140 in a wiring region may extend to an active region and may be connected to the first electrode 140 of a resonator 135. In the example embodiment illustrated in FIG. 6, the additional layer 145 may be formed of an insulating material. As the additional layer 145 is formed of an insulating material, even when the additional layer 145 is connected to the first electrode 140 of a resonator 135, the additional layer 145 may not affect properties of the bulk-acoustic wave resonator.

In the example embodiments described above, the additional layer 145 may be arranged in an upper portion of the first electrode 140, but example embodiments are not limited thereto. In example embodiments, the additional layer 145 may be arranged in a lower portion of the first electrode 140 arranged in the wiring region.

Figure 7:
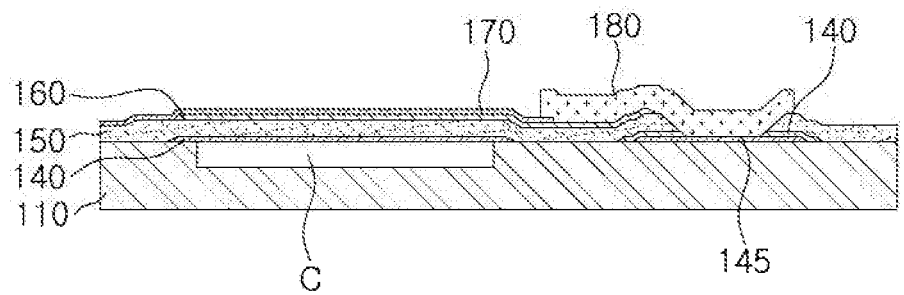
Figure 8:
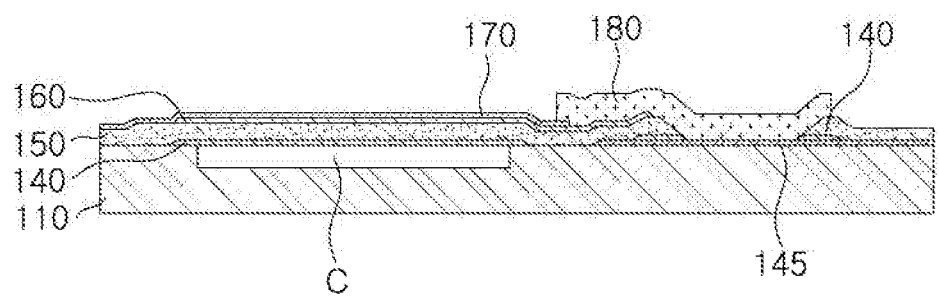

Referring to FIGS. 7 and 8, an additional layer 145 may be arranged in a lower portion of a first electrode 140 arranged in a wiring region, and referring FIG. 7, the first electrode 140 may cover the additional layer 145, and may be disposed in an inner region of the additional layer 145.

As an example, a bulk-acoustic wave resonator in the example embodiment illustrated in FIG. 7 may be an example embodiment in which a position of the first electrode 140 and a position of the additional layer 145 of a bulk-acoustic wave resonator in the example embodiment illustrated in FIG. 1 are changed with respect to each other. The bulk-acoustic wave resonator in the example embodiment illustrated in FIG. 8 may be an example embodiment in which a position of the first electrode 140 and a position of the additional layer 145 of a bulk-acoustic wave resonator in the example embodiment illustrated in FIG. 5 are changed with respect to each other.

In the example embodiments in FIGS. 7 and 8, the additional layer 145 may be formed of a metal. As the additional layer 145 is formed of a metal, even when the first electrode 140 is completely removed, the wiring electrode 180 may be electrically connected to the additional layer 145, and a connected state may be maintained.

In the example embodiments described above, the additional layer 145 may be configured as a single layer, but example embodiments thereof are not limited thereto. In examples, the additional layer 145 may be configured as two or more layers.

Figure 9:
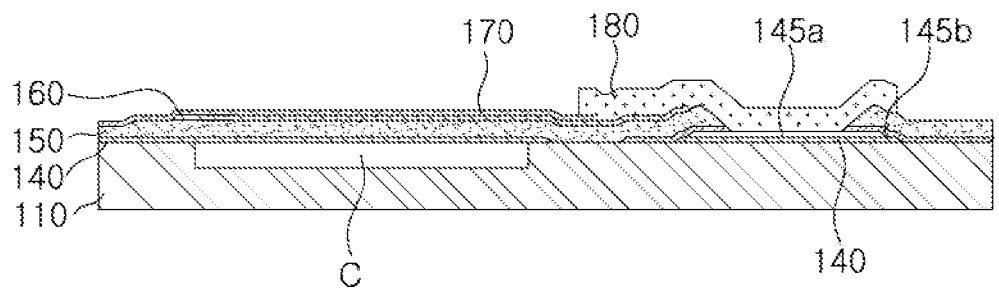

Referring to FIG. 9, a bulk-acoustic wave resonator 100 in the example embodiments may include at least two additional layers 145. As an example, the additional layer 145 may include a first additional layer 145a and a second additional layer 145b. Both of the first additional layer 145a and the second additional layer 145b may be formed of an insulating material, or may be formed of a metal. Alternatively, one of the first additional layer 145a and the second additional layer 145b may be formed of an insulating material, and the other may be formed of a metal.

Referring to FIG. 9, the first additional layer 145a may be formed in an inner region of a first electrode 140 arranged in a wiring region, and the second additional layer 145b may be configured to cover the first additional layer 145a and the first electrode 140, and may be patterned through an etching process. In the example embodiment illustrated in FIG. 9, the first additional layer 145a may be formed of a metal, and the second additional layer 145b may be formed of an insulating material.

In the example embodiment illustrated in FIG. 9, the first additional layer 145a may be disposed in an inner region of the first electrode 140, but example embodiments thereof are not limited thereto. The first additional layer 145a may cover the first electrode 140, and the second additional layer 145b covering the first additional layer 145a and the first electrode 140 may extend to an active region and may be connected to the first electrode 140 of the resonator 135.

FIGS. 10 to 13 are diagrams illustrating a structure of a bulk-acoustic wave resonator according to one or more example embodiments.

In the descriptions above, various example embodiments are described based on a structure of a bulk-acoustic wave resonator in which a cavity C is buried in the substrate 110, and the example embodiments may be applied to a structure of a bulk-acoustic wave resonator illustrated in FIGS. 10 to 13.

Figure 10:
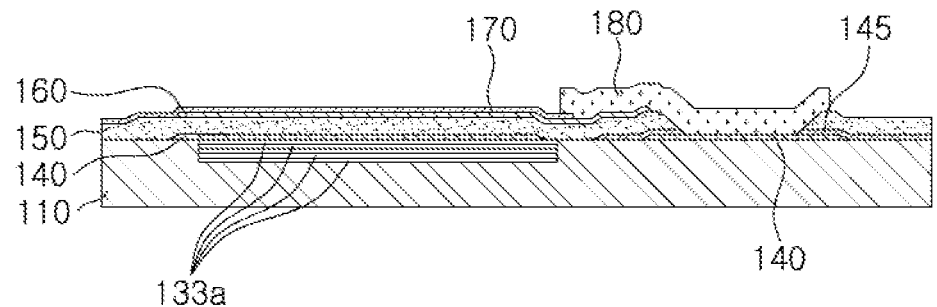
FIGS. 10, 11, 12, and 13 are diagrams illustrating a structure of a bulk-acoustic wave resonator according to one or more example embodiments of the present disclosure.

Referring to FIG. 10, example embodiments may be applied to the bulk-acoustic wave resonator illustrated in FIG. 1 in which a plurality of reflective layers 133a are provided in a cavity C.

In FIG. 10, the reflective layer 133a may be formed of a silicon oxide-based material, a silicon nitride-based material, an aluminum oxide-based material, or an aluminum nitride-based material. The reflective layer 133a may also be formed of a material including at least one element or a combination of at least two elements among molybdenum (Mo), ruthenium (Ru), tungsten (W), and platinum (Pt). The reflective layer 133a may reflect a wireless frequency signal output from a resonator 135.

Figure 11:
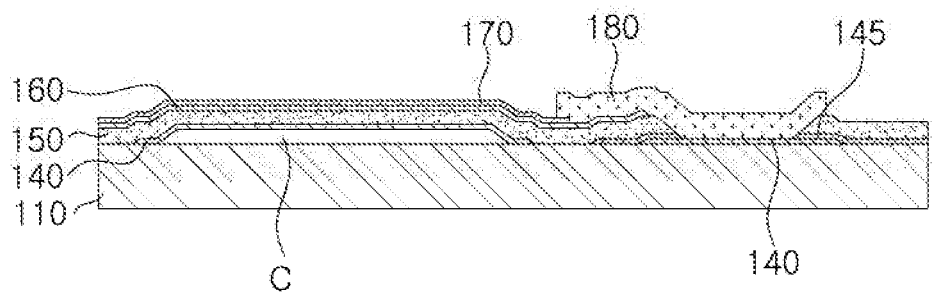
Figure 12:
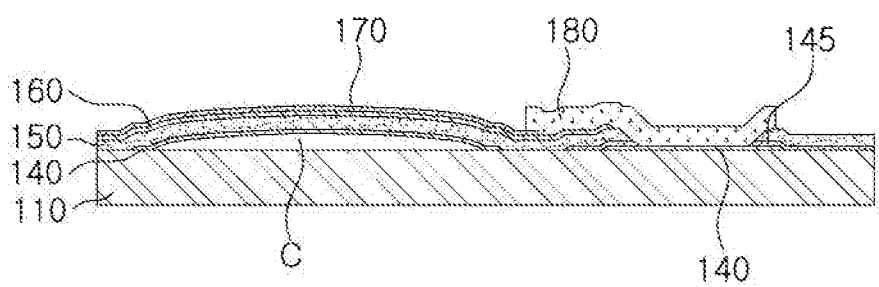

Referring to FIGS. 11 and 12, various example embodiments may be applied to a bulk-acoustic wave resonator including a cavity C having a mesa shape or a dome shape.

The cavity C in FIGS. 11 and 12 may be formed by processes of forming a sacrificial layer having a mesa shape or a dome shape on a substrate 110, forming a membrane on the sacrificial layer, and etching and removing the sacrificial layer. The membrane may function as an oxidation protective film, or may function as a protective layer protecting the substrate 110. The membrane may include at least one of silicon dioxide (SiO$_2$), silicon nitride (SiN), aluminum nitride (AlN), and aluminum oxide (Al$_2$O$_3$).

Figure 13:
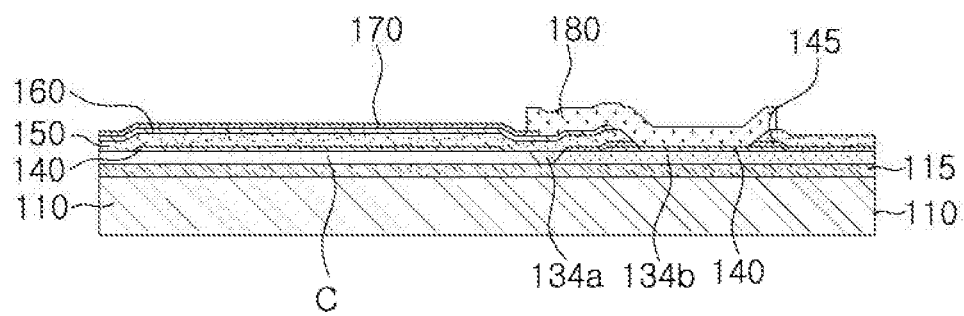

Referring to FIG. 13, example embodiments may be applied to a bulk-acoustic wave resonator having a flat structure as illustrated in FIG. 13.

An example process of manufacturing a bulk-acoustic wave resonator 100 may start with forming an insulating layer 115 on a substrate 110. A sacrificial layer may be disposed on the insulating layer 115, a portion of the sacrificial layer may be removed, and a pattern defining a region of a support portion 134a may be formed. As an example, a width of an upper surface of the pattern formed on the sacrificial layer may be greater than a width of a lower surface, and side surfaces of the pattern connecting an upper surface and a lower surface may be inclined. After forming the pattern on the sacrificial layer, an etch stop material may be disposed on an upper surface of the sacrificial layer and an upper surface of the insulating layer 115 externally exposed through the pattern. The etch stop material may cover the sacrificial layer and the insulating layer 115.

After forming the etch stop material, one surface of the etch stop material may be planarized to externally expose the sacrificial layer. A portion of the etch stop material may be removed during the process of planarizing one surface of the etch stop material, and after a portion of the etch stop material is removed, the support portion 134a may be formed by the etch stop material remaining in the pattern.

As the result of the planarization of the etch stop material, one surfaces of the support portion 134a and the sacrificial layer may be planar. A membrane, a first electrode 140, a piezoelectric layer 150, and a second electrode 160, and so on, may be stacked on the planar one surface, and a cavity C may be formed through an etching process for etching and removing the sacrificial layer. An auxiliary support portion 134b may be formed by the remaining sacrificial layer.

According to the aforementioned example embodiments, the bulk-acoustic wave resonator in the example embodiments may prevent loss of electrode in the wiring region.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
   a substrate;
   a cavity formed in the substrate;
   a first electrode, a piezoelectric layer, and a second electrode stacked in order on the substrate;
   a resonator defined by the first electrode, the piezoelectric layer, and the second electrode overlapping in a vertical direction in an upper portion of the cavity;
   an additional layer disposed on one surface of a portion of the first electrode disposed in a wiring region on an external side of the resonator; and
   a wiring electrode connected to the first electrode disposed in the wiring region,
   wherein the first electrode forms a contact interfacial surface with the additional layer and the wiring electrode, and
   wherein the additional layer does not overlap the cavity in the vertical direction.

2. The bulk-acoustic wave resonator of claim 1, wherein the additional layer is disposed on an upper surface of the portion of the first electrode disposed in the wiring region, and comprises a pattern exposing the portion of the first electrode disposed in the wiring region, and
   wherein the portion of the first electrode disposed in the wiring region is connected to the wiring electrode through the pattern.

3. The bulk-acoustic wave resonator of claim 2, wherein the additional layer covers edges of the portion of the first electrode disposed in the wiring region.

4. The bulk-acoustic wave resonator of claim 3,
   wherein a portion of the first electrode disposed in the resonator and the portion of the first electrode disposed in the wiring layer are separated from each other, and
   wherein a portion of the additional layer covering the edges of the portion of the first electrode disposed in the wiring region extends to the resonator and is connected to the portion of the first electrode disposed in the resonator.

5. The bulk-acoustic wave resonator of claim 2, wherein the additional layer is disposed in an internal region of the upper surface of the portion of the first electrode disposed in the wiring region.

6. The bulk-acoustic wave resonator of claim 2, wherein the piezoelectric layer is disposed in an upper portion of the additional layer, and a pattern of the piezoelectric layer is the same as a pattern of the additional layer.

7. The bulk-acoustic wave resonator of claim 1, wherein the additional layer is disposed on a lower surface of the first electrode.

8. The bulk-acoustic wave resonator of claim 1, wherein the additional layer is formed of one of an insulating material and a metal.

9. The bulk-acoustic wave resonator of claim 1, wherein an etch rate of the additional layer is different than an etch rate of the first electrode.

10. The bulk-acoustic wave resonator of claim 1, wherein the additional layer comprises a first additional layer and a second additional layer disposed in order on an upper surface of the first electrode.

11. A bulk-acoustic wave resonator, comprising:
    a substrate;
    a plurality of cavities formed in the substrate;
    a first electrode, a piezoelectric layer, and a second electrode stacked in order on the substrate;
    a plurality of resonators defined by the first electrode, the piezoelectric layer, and the second electrode overlapping in a vertical direction in upper portions of the plurality of cavities;
    a wiring region including a wiring electrode connecting portions of the plurality of resonators;
    an additional layer disposed on an upper surface of a portion of the first electrode disposed in the wiring region, wherein the additional layer is divided into a plurality of regions having different thicknesses, and the plurality of regions are connected to the wiring electrode, and wherein a groove is formed in an upper surface of the additional layer.

12. The bulk-acoustic wave resonator of claim 11, wherein the additional layer comprises a first region comprising a first thickness and a second region comprising a second thickness.

13. The bulk-acoustic wave resonator of claim 12, wherein the first thickness is greater than the second thickness.

14. The bulk-acoustic wave resonator of claim 12, wherein the first region surrounds the second region.

15. The bulk-acoustic wave resonator of claim 14, wherein the additional layer is separated from a portion of the first electrode disposed in the plurality of resonators.

16. The bulk-acoustic wave resonator of claim 11, wherein the additional layer is formed of a metal.

17. A bulk-acoustic wave resonator, comprising:
a resonator comprising a cavity, a first electrode, a piezoelectric layer, and a second electrode stacked in order on a substrate;
an additional layer disposed on the first electrode in a wiring region on an external side of the resonator; and
a wiring electrode connected to the first electrode disposed in the wiring region,
wherein the first electrode forms a contact interfacial surface with the additional layer on the wiring electrode, and
wherein the additional layer does not overlap the cavity in a direction in which the cavity, the first electrode, the piezoelectric layer, and the second electrode are stacked in order on the substrate.

18. The bulk-acoustic wave resonator of claim 17, wherein the first electrode forms a contact interfacial surface with the wiring electrode.

19. The bulk-acoustic wave resonator of claim 17, wherein the additional layer comprises a first region comprising a first thickness and a second region comprising a second thickness less than the first thickness, and wherein the first electrode is spaced apart from the wiring electrode by at least the second thickness.

20. The bulk-acoustic wave resonator of claim 17, wherein the cavity is formed above the substrate in a mesa shape or a dome shape.

21. A bulk-acoustic wave resonator, comprising:
a substrate;
a cavity formed in the substrate;
a first electrode, a piezoelectric layer, and a second electrode stacked in order on the substrate;
a resonator defined by the first electrode, the piezoelectric layer, and the second electrode overlapping in a vertical direction in an upper portion of the cavity;
an additional layer disposed on an upper surface of a portion of the first electrode disposed in a wiring region on an external side of the resonator; and
a wiring electrode connected to the portion of the first electrode disposed in the wiring region,
wherein the first electrode forms a contact interfacial surface with the additional layer and the wiring electrode, and
wherein the additional layer covers edges of the portion of the first electrode disposed in the wiring region.

22. A bulk-acoustic wave resonator, comprising:
a resonator comprising a cavity, a first electrode, a piezoelectric layer, and a second electrode stacked in order on a substrate;
an additional layer disposed on the first electrode in a wiring region on an external side of the resonator; and
a wiring electrode connected to the first electrode disposed in the wiring region,
wherein the first electrode forms a contact interfacial surface with the additional layer on the wiring electrode,
wherein the additional layer comprises a first region comprising a first thickness and a second region comprising a second thickness less than the first thickness, and
wherein the first electrode is spaced apart from the wiring electrode by at least the second thickness.

* * * * *